United States Patent
Dally

(10) Patent No.: US 11,070,205 B1
(45) Date of Patent: Jul. 20, 2021

(54) GLITCH-FREE MULTIPLEXER

(71) Applicant: NVIDIA Corporation, Santa Clara, CA (US)

(72) Inventor: William James Dally, Incline Village, NV (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 16/919,324

(22) Filed: Jul. 2, 2020

(51) Int. Cl.
  *H03K 19/003* (2006.01)
  *G06N 3/063* (2006.01)

(52) U.S. Cl.
  CPC ......... *H03K 19/003* (2013.01); *G06N 3/0635* (2013.01)

(58) Field of Classification Search
  None
  See application file for complete search history.

(56) References Cited

U.S. PATENT DOCUMENTS

| | | | | |
|---|---|---|---|---|
| 5,231,636 A * | 7/1993 | Rasmussen | ............. | H04J 3/047 327/387 |
| 5,315,181 A * | 5/1994 | Schowe | .................... | G06F 1/08 326/93 |
| 6,559,679 B2 * | 5/2003 | Kim | .......................... | G06F 1/08 326/93 |
| 7,143,071 B2 * | 11/2006 | Chen | ..................... | G06F 1/3203 706/19 |
| 7,245,161 B2 * | 7/2007 | Boerstler | ......... | G01R 31/31708 327/407 |
| 7,446,588 B2 * | 11/2008 | Boerstler | .................. | G06F 1/08 327/294 |
| 9,673,820 B2 * | 6/2017 | Ganor | .................... | H03K 3/013 |
| 10,372,868 B2 * | 8/2019 | Huang | .................... | G06F 30/30 |
| 10,594,309 B2 * | 3/2020 | Agrawal | .................. | H03K 7/06 |
| 10,855,306 B2 * | 12/2020 | Egan | ..................... | H03M 3/324 |

* cited by examiner

*Primary Examiner* — Lincoln D Donovan
*Assistant Examiner* — Khareem E Almo
(74) *Attorney, Agent, or Firm* — Leydig, Voit & Mayer, Ltd.

(57) ABSTRACT

When a signal glitches, logic receiving the signal may change in response, thereby charging and/or discharging nodes within the logic and dissipating power. Providing a glitch-free signal may reduce the number of times the nodes are charged and/or discharged, thereby reducing the power dissipation. A technique for eliminating glitches in a signal is to insert a storage element that samples the signal after it is done changing to produce a glitch-free output signal. The storage element is enabled by a "ready" signal having a delay that matches the delay of circuitry generating the signal. The technique prevents the output signal from changing until the final value of the signal is achieved. The output signal changes only once, typically reducing the number of times nodes in the logic receiving the signal are charged and/or discharged so that power dissipation is also reduced.

20 Claims, 15 Drawing Sheets

GLITCH-FREE MULTIPLEXER

TECHNICAL FIELD

The present disclosure relates to preventing glitch propagation in circuits. In particular, the disclosure relates to eliminating glitches in a signal by inserting a storage element that samples the signal to produce a glitch-free output signal.

BACKGROUND

Conventional sequential circuitry includes combinational logic with inputs driven by synchronous registers or flip-flops. "Combinational logic" refers to logic that receives one or more inputs that are combined to produce an output without storing state for the inputs, output, or any intermediate values. In other words, combinational logic is "stateless" and may be asynchronous (not driven by a clock signal). In contrast, for sequential circuitry (logic), the registers store state.

On the rising edge of a clock, outputs of the registers change exactly once. However, multiple paths through the combinational logic may result in signals output by the combinational logic changing multiple times before reaching their final levels. The signals may be data inputs to a multiplexer and a select signal that causes the multiplexer to select one of the data inputs for output. The output of the multiplexer may change several times in response to the changing data and select inputs before settling to a final state. The changes in the output of the multiplexer are considered glitches and additional combinational logic receiving the output may respond by charging and/or discharging nodes and dissipating power. Providing a glitch-free output signal may reduce the number of times the nodes are charged and/or discharged, thereby reducing the power dissipated by the additional combinational logic. There is a need for addressing these issues and/or other issues associated with the prior art.

SUMMARY

When a signal glitches, logic receiving the signal may change in response, thereby charging and/or discharging nodes within the logic and dissipating power. In the context of the following description, a glitch is at least one high or a low pulse of at least one bit of a signal within a clock cycle. Specifically, the pulse is a high-low-high transition or a low-high-low transition. Providing a glitch-free signal may reduce the number of times the nodes are charged and/or discharged, thereby reducing the power dissipation. A technique for eliminating glitches in a signal is to insert a storage element that samples the signal after it is done changing to produce a glitch-free output signal. The storage element is enabled by a "ready" signal having a delay that matches the delay of circuitry generating the signal. The ready-enabled storage element prevents the output signal from changing until the final value of the signal is achieved. The output signal changes only once, transitioning low-high or high-low, typically reducing the number of times nodes in the logic receiving the signal are charged and/or discharged so that power dissipation is also reduced.

A method, computer readable medium, and system are disclosed for preventing glitch propagation. In an embodiment, a decoder circuit is configured receive a select ready signal that is negated until a select signal generated by combinational logic is unchanging and is asserted after the select signal is unchanging. The decoder circuit generates, according to the select signal, at least one sample enable signal corresponding to a set of data input signals, where the at least one sample enable signal is negated while the select ready signal is negated and is asserted in response to assertion of the select ready signal. The decoder circuit generates a hold signal that is asserted while the at least one sample enable signal is negated and is negated in response to assertion of the at least one sample enable signal. A sampling circuit is configured to hold an output signal unchanged while the hold signal is asserted and sample one of the data input signals according to the at least one sample enable signal while the hold signal is negated to transfer a level of the sampled data input signal to the output signal.

DETAILED DESCRIPTION

Figure 1A:
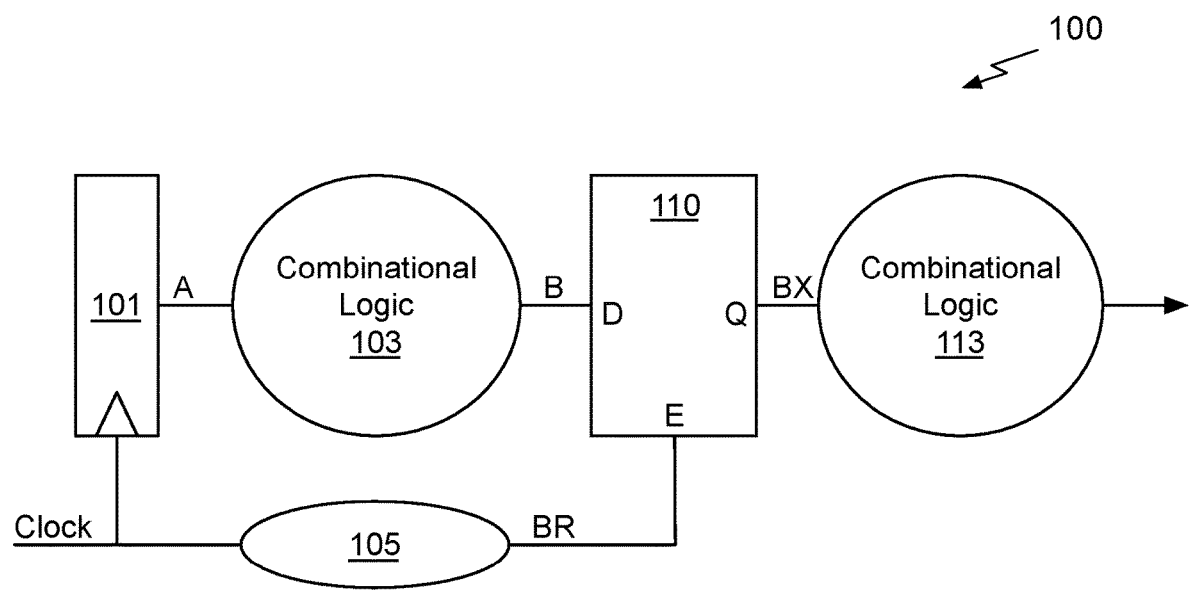
FIG. 1A illustrates a block diagram of a glitch-free sampling circuit and combinational logic, in accordance with an embodiment.

An output of a multiplexer may change several times before settling to a final state in response to changing data and select inputs. In the context of the following description, a change is a transition in a voltage level that is recognized as a different state. For example, a change recognized as an asserted state compared with a negated or un-asserted state. In another example, a change is a transition from a high level to a low level or from a low level to a high level. In the context of the following description, a stable or constant level may vary while remaining within a range of voltage values that is recognized as the same state (e.g., logic true or logic false).

Multiple changes in the output of the multiplexer are considered glitches and combinational logic receiving the output may respond by charging and/or discharging nodes within the combinational logic and dissipating power. Glitches may be prevented by inserting additional registers to reduce power dissipation. For example, the data and select inputs can be registered by inserting flip-flops at the inputs to the multiplexer. The registers add a pipeline stage and prevent glitches at the inputs to the multiplexer because each input will only change once (or remain constant) at the clock edge. However, the registers are expensive in terms of both power dissipation, latency, and die area. Alternatively, the output of the multiplexer may be registered using a delayed clock that ensures all of the inputs to the multiplexer reach their final states and the output of the multiplexer is no longer changing before the output of the multiplexer is registered. Inserting the register at the output of the multiplexer reduces power dissipation of the multiplexer and the additional combinational logic. However, the register is an expensive solution.

Another technique for eliminating glitches in a signal is to insert a storage element that samples the signal after it is done changing to produce a glitch-free output signal within the clock cycle. The storage element is enabled by a "ready" signal having a delay that matches the delay of circuitry generating the signal. The technique prevents the output signal from changing until the final value of the signal is achieved. Providing a glitch-free signal may reduce the number of time the nodes in logic receiving the signal are charged and/or discharged, thereby reducing the power consumed by the logic.

For example, a multiplexer may be used to select only non-zero activations and/or weights for convolution operations in a convolutional neural network. If the select signal for the multiplexer glitches, inputs to a multiplier may glitch, causing the multiplier to evaluate several different products, resulting in several times more power dissipation compared with evaluating the single product. Providing a glitch-free select signal to select glitch-free non-zero values, as described further herein, may reduce power dissipation. In the context of the following description, changing signals are ignored until the signal becomes stable, at which time the signal may be sampled so that combinational logic receiving the signal evaluates once.

FIG. 1A illustrates a block diagram 100 of a glitch-free sampling circuit 110 and combinational logic 103 and 113, in accordance with an embodiment. A register outputs signal A in response to a rising edge of a clock signal. The level of input signal A may change or remain the same, in response to an input (not explicitly shown) to register 101, at each rising edge of the clock signal and is stable (constant) between rising edges of the clock signal. Combinational logic 103 receives input signal A and generates output signal B. Combinational logic 103 may also receive one or more additional inputs and generate one or more additional outputs (not explicitly shown). Due to different timing paths in the combinational logic 103, the output signal B may transition through several intermediate states before settling at a final value. If the glitching output signal B were to be directly input to combinational logic 113, such as a complex arithmetic circuit, the glitching may result in high power dissipation.

A delay circuit 105 is configured to match a propagation delay for a transition of signal A to a valid output for signal B. In an embodiment, the propagation delay is equal to or greater than a worst-case propagation delay. In an embodiment, the propagation delay is greater than the worst-case propagation delay. In an embodiment, the delay circuit 105 comprises an even number of inverters coupled in series. The delay circuit 105 receives the clock as an input and outputs signal BR (B ready) that indicates when the signal B is stable (glitch-free) and should be sampled.

The sampling circuit 110 is a latch storage element configured to sample an input D when an enable input E is asserted, propagating the level of the sampled input signal B to an output Q to generate an output signal BX. The sampling circuit 110 is transparent while the signal BR is asserted and the output signal BX "follows" the input signal B. The output signal BX is an input signal to the combinational logic 113. While the signal BR coupled to the enable input E is negated, the sampling circuit 110 is opaque, the input signal B is not sampled and signal BX is held stable. However, because the input signal B is glitch-free while the signal BR is asserted, the output signal BX changes at most once—in response to the signal BR transitioning from being negated to being asserted. In other words, the level of B is sampled after achieving a steady state and in response to the signal BR being asserted.

Figure 1B:
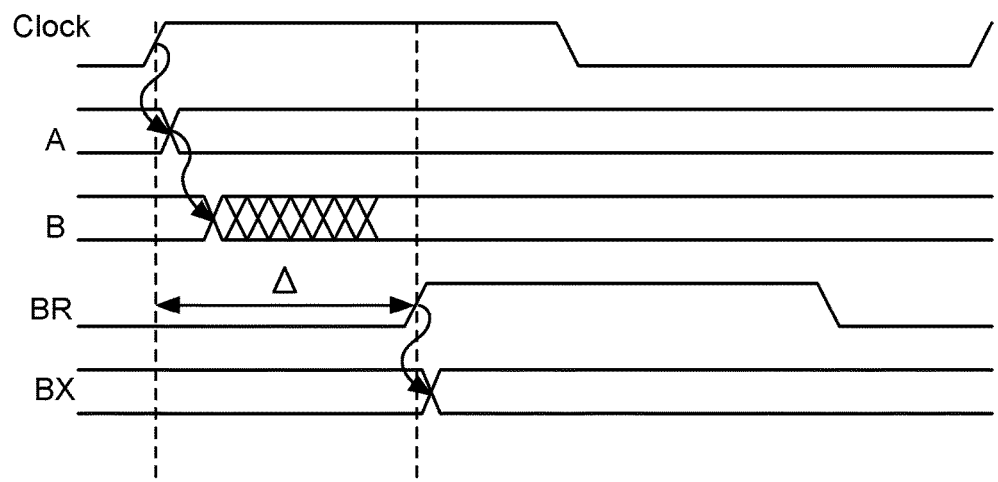
FIG. 1B illustrates a timing diagram for the circuit shown in FIG. 1A, in accordance with an embodiment.

FIG. 1B illustrates a timing diagram for the sampling circuit 110 shown in FIG. 1A, in accordance with an embodiment. Shortly after a rising edge of the clock signal, signal A is valid and stable. Signal A propagates through the combinational logic 103 and signal B glitches, toggling between high and low levels, before eventually reaching a stable level. The clock signal is delayed by a matched delay 4 provided by the delay circuit 105 to produce the rising edge for BR. The matched delay used to generate the signal BR is long enough to ensure that the signal B has finished changing and is stable. When the signal BR is asserted, the signal B is sampled and propagated to the signal BX. When the signal BR is negated, the sampling of signal B ceases and the level of signal BX is held. Importantly, the glitch-free signal BX transitions once or simply remains constant (when signal B is unchanged compared with the previous clock cycle) for each clock cycle. The sampling circuit 110 effectively filters glitches, so that combinational logic 113 is evaluated only once, thereby minimizing power dissipation.

In another embodiment, the signal A is valid and stable at the falling edge of the clock signal instead of at the rising edge of the clock signal. In this other embodiment, when the signal BR is negated, the signal B is sampled and propagated to the signal BX and when the signal BR is asserted, the sampling of signal B ceases and the level of signal BX is held. Persons of ordinary skill in the art will understand that any logic that performs the operations of the block diagram 100 and corresponding waveforms shown in FIG. 1B is within the scope and spirit of embodiments of the present disclosure.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1C:
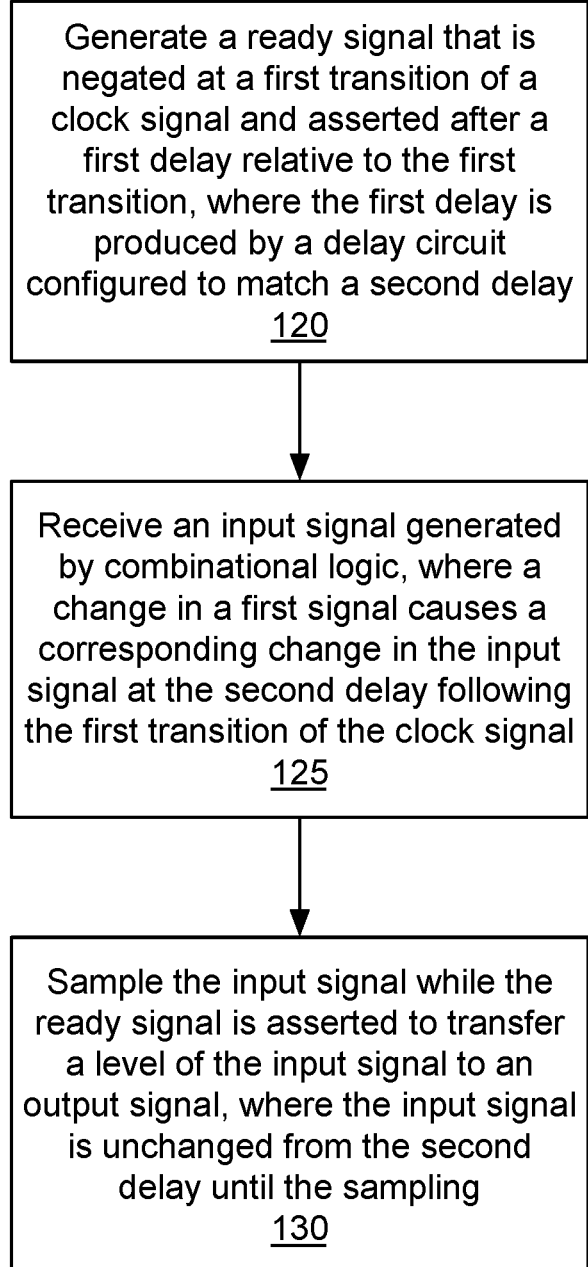
FIG. 1C illustrates a flowchart of a method for generating a glitch-free signal, in accordance with an embodiment.

FIG. 1C illustrates a flowchart of a method 115 for generating a glitch-free signal, in accordance with an embodiment. The method 115 is described in the context of logic or circuitry and may also be performed within a processor. For example, the method 115 may be executed by a GPU (graphics processing unit), CPU (central processing unit), or any processor capable of generating the glitch-free signal. Furthermore, persons of ordinary skill in the art will understand that any system that performs method 115 is within the scope and spirit of embodiments of the present disclosure.

At step 120, a ready signal is generated that is negated at a first transition of a clock signal and asserted after a first delay relative to the first transition, where the first delay is produced by a delay circuit configured to match a second delay. In an embodiment, the first delay matches the second delay when the first delay equals the second delay. In an embodiment, the first delay matches the second delay when the first delay is equal to or is greater than the second delay. In an embodiment, the first delay is greater than the second delay and is within the same clock cycle. In an embodiment, the ready signal is BR, the first delay is produced by the delay circuit 105, and the second delay is the propagation delay through the combinational logic 103. In an embodiment, the delay circuit 105 inverts the clock signal to generate the ready signal. In an embodiment, the delay circuit 105 comprises a chain of inverters coupled in series.

At step 125, an input signal generated by combinational logic is received, and, following the first transition of the clock signal, a change in a first signal causes a corresponding change in the input signal at the second delay. In an embodiment, the input signal B generated by the combinational logic 103 is received at the sampling circuit 110 and a change in the signal A causes a corresponding change in the input signal B at the matched delay. In an embodiment, the change in the first signal is a falling transition from a high to low level. In another embodiment, the change in the first signal is rising transition from a low to high level.

At step 130, the input signal is sampled while the ready signal is asserted to transfer a level of the input signal to an output signal, wherein the input signal is unchanged from the second delay until the sampling. In an embodiment, the input signal B is sampled by the sampling circuit 110 to transfer the level of the input signal B to the output signal BX. In an embodiment, the sampling circuit 110 is configured to hold the output signal BX at a constant level from the first transition of the clock signal until the input signal B is sampled. In an embodiment, the input signal B changes (glitches) at least once after the first transition of the clock signal and before the second delay.

In an embodiment, the delay circuit is further configured to negate the ready signal after a third delay relative to the first delay, where the ready signal is negated before the next clock period. In an embodiment, the sampling circuit is further configured to generate an output ready signal that is negated for the first delay and asserted once the level of the input signal is transferred to the output signal. In an embodiment, the ready signal is negated in response to assertion of the output ready signal.

Figure 1D:
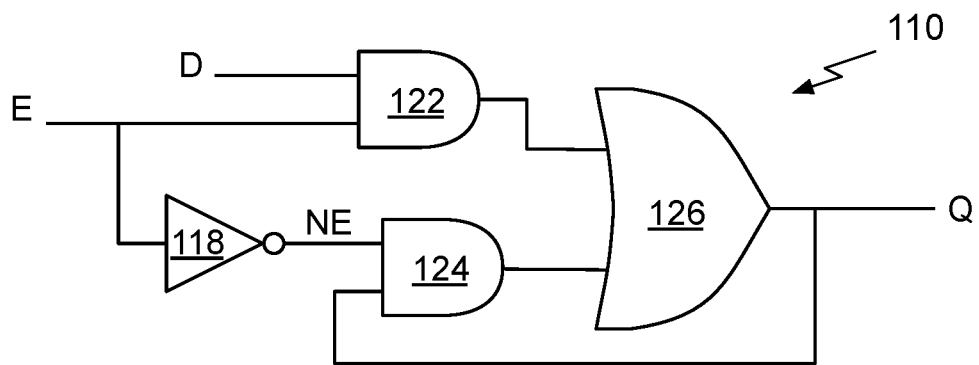
FIG. 1D illustrates a glitch-free sampling circuit, in accordance with an embodiment.

FIG. 1D illustrates the glitch-free sampling circuit 110, in accordance with an embodiment. The sampling circuit 110 includes two AND gates 122 and 124, a OR gate 126, and an enable inverter 118. When the enable E and D inputs are both high (asserted) the output of AND gate 122 is high, and, as a result, the output Q of the OR gate 126 is asserted. Otherwise, the output of gate 122 is low (negated).

The output Q of the OR gate 126 is fed back within the sampling circuit 110 and is input to the AND gate 124. The enable signal E is inverted by the enable inverter 118 to produce signal NE (not enable) that is input to the AND gate 124. Therefore, when the enable signal is high, the feedback path is effectively disabled by the AND gate 124. When the enable signal is low (NE is high), the feedback path is enabled by the AND gate 124, propagating the level of the output Q to the OR gate 126 to hold the level at the output Q stable until the enable signal is asserted. In other words, the enable inverter 118 is configured to enable the feedback path to hold the output signal Q constant until after the D input signal is sampled. The enable inverter 118 ensures that when the enable signal E transitions from low to high that the NE signal remains high, so that the feedback path remains enabled through the AND gate 124 until the enable signal rises and the input D propagates through to the output Q, ensuring that Q does not glitch low as the enable E is asserted when D is asserted. For example, if NE signal were to transition low and drive the output of AND gate 124 low before a high level of D propagated through the AND gate 122 when E transitions high, both inputs to the OR gate 126 would simultaneously be low, causing the output Q to glitch low before the output of AND gate 122 drives the output Q high.

In an embodiment, an output ready signal is generated that indicates when the Q output is ready to be sampled by receiving logic. In an embodiment, the output ready signal is negated during the delay provided by the delay circuit 105 and asserted once the level of the input signal D is transferred to the output signal Q. In an embodiment, the enable signal E is negated in response to an assertion of the output ready signal. In an embodiment, a delay circuit that matches the propagation delay from the enable signal E to the output signal Q is used to delay the enable signal E to generate the output ready signal. In an embodiment, an even number of inverters coupled in series delays the enable signal E to produce the output ready signal.

Figure 1E:
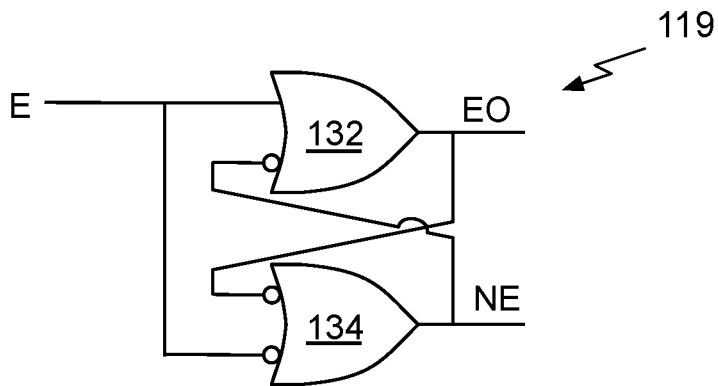
FIG. 1E illustrates an overlap inverter circuit, in accordance with an embodiment.

FIG. 1E illustrates an inverter circuit 119, in accordance with an embodiment. The inverter circuit 119 includes two cross-coupled logic gates that generate EO (enable output) and NE. The cross-coupled logic gates are an OR gate 132 with one inverted input to generate EO and a NAND gate 134 to generates NE. The enabled input E is input to both logic gates. When enable E transitions from low to high, the OR gate 132 drives EO from low to high. When the rising edge of EO is received at the NAND gate 134, the NE output transitions low. The propagation delay through the NAND gate 134 ensures that EO and NE are simultaneously high, providing the overlap time. Similarly, when enable E transitions from high to low, the NAND gate 134 drives NE from low to high. When the rising edge of NE is received at the OR gate 132, EO is driven from high to low and the propagation delay through the OR gate 132 ensures that EO and NE are simultaneously high, providing the overlap time. It will be appreciated that the inverter circuit 119 can replace enable inverter 118 in sampling circuit 110 with EO routed to AND gate 122 and NE routed to AND gate 124.

Figure 1F:
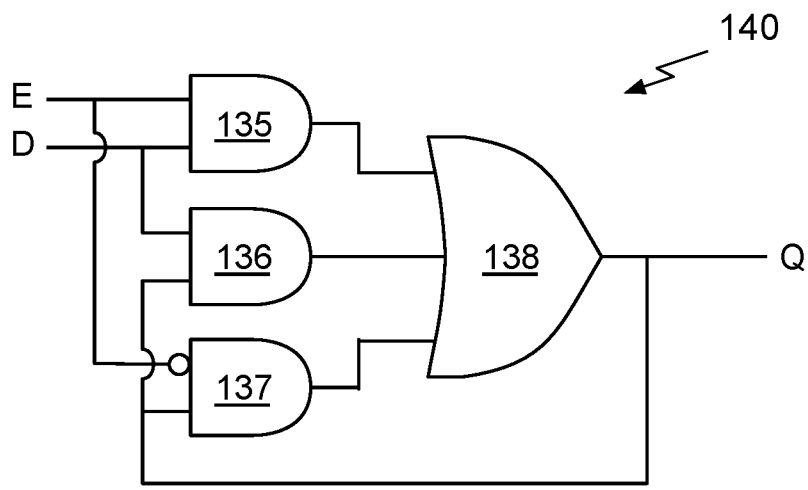
FIG. 1F illustrates another glitch-free sampling circuit, in accordance with an embodiment.

FIG. 1F illustrates another glitch-free sampling circuit 140, in accordance with an embodiment. The glitch-free sampling circuit 110 may be replaced with glitch-free sampling circuit 140. An OR gate 138 receives intermediate signals generated by AND gates 135, 136, and 137, where AND gate 137 has one input that is inverted. AND gate 135 propagates input D to OR gate 138 to drive output Q high when input D and enable E are both high. AND gate 137 provides a feedback path to hold output Q high when enable E is low. AND gate 136 provides a feedback path to hold output Q high when input D is high, regardless of the level of enable E, thereby preventing output Q from glitching low during a rising edge of enable E when input D is high. The output Q is driven low when input D is low and enable E is high or when enable E is low and output Q is low.

Returning to the block diagram 100 of FIG. 1A, in cases where the signal B is delayed by a large amount—more than half a clock—it may be desirable to have an "asymmetric" ready signal, BRA, that is high for a longer time than it is low. In an embodiment, the asymmetric ready signal BRA is low by the end of the clock cycle.

Figure 1G:
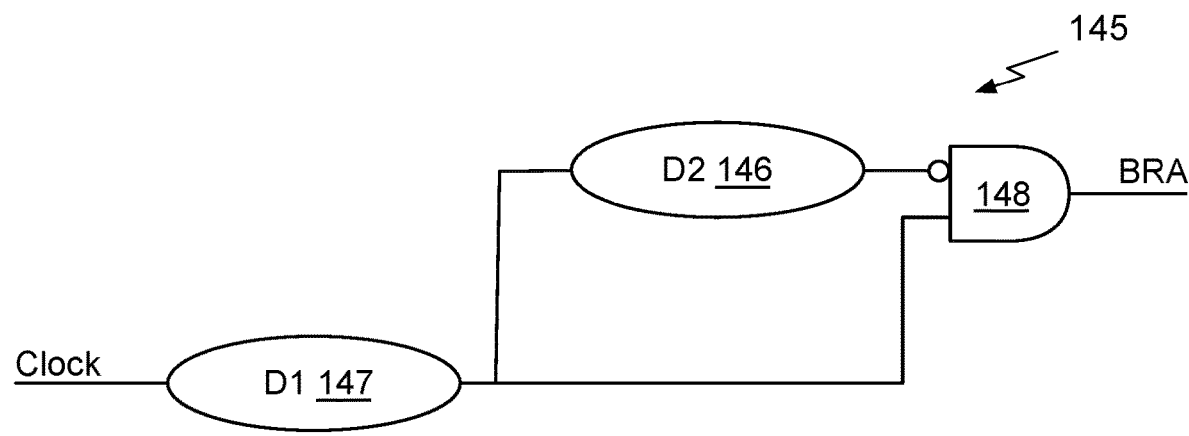
FIG. 1G illustrates an asymmetric ready signal generation circuit, in accordance with an embodiment.

FIG. 1G illustrates an asymmetric ready signal generation circuit 145, in accordance with an embodiment. The asymmetric ready signal generation circuit 145 may replace the delay circuit 105 in the block diagram 100. The ready signal BRA is delayed D1 from the rising edge of the clock signal and has a width equal to D2. A first delay circuit 147 provides a delay of D1 and a second delay circuit 146 provides a delay of D2. An AND gate 148 with one inverted input generates the output BRA. In an embodiment, the first and second delay circuits 147 and 146 are implemented using a chain of inverters coupled in series, where an intermediate output in the chain provides the delay D1 and a further delayed output of the chain provides the delay D2.

Figure 1H:
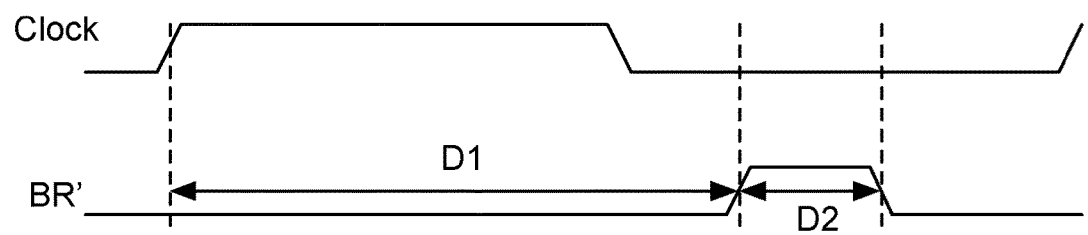
FIG. 1H illustrates timing diagram for the asymmetric ready signal generation circuit of FIG. 1G, in accordance with an embodiment.

FIG. 1H illustrates timing diagram for the asymmetric ready signal generation circuit of FIG. 1G, in accordance with an embodiment. The first delay circuit 147 causes the rising edge of the BRA to occur time D1 after the rising edge of the clock. The second delay circuit 146, sets the pulse width of signal BRA to D2. The asymmetric ready signal BRA rises while the clock signal is low and falls before the start of the next clock period.

The glitch-free sampling circuit 110 is a storage element that may be used to eliminate glitches in a signal by sampling the signal after the signal is done changing levels and is stable. The ready signal has a delay that matches the delay of circuitry generating the signal and enables the sampling to transfer the stable level of the signal to an output in a glitch-free manner. Sampling based on the ready signal produces a glitch-free output signal. Any changes of the signal before the signal is sampled are filtered out by the glitch-free sampling circuit 110, reducing the number of times nodes within logic receiving the output signal are charged and discharged. As a result, the power consumed by the logic receiving the output signal is reduced compared with directly receiving the changing signal.

Glitch-Free Multiplexer

Ideally, to minimize charging and discharging nodes within combinational logic receiving the output of a multiplexer, the output of a multiplexer would be held unchanging until all of the inputs including the select signal, have reached their final states and then the output would change exactly once (or remain the same). Glitchless (glitch-free) multiplexing may be achieved by using "bundled" self-timed signaling. Specifically, a "ready" signal may be associated with each, possibly multi-bit, logic signal (e.g., data input and select). The ready signal is asserted only when the associated logic signal has reached a final state within the clock cycle and is unchanging (e.g., glitch-free).

A signal "BR", for example, indicates when signal "B" is ready. As previously described, the ready signals may be generated from the clock signal by a delay circuit having a delay that is matched to a combinational logic block that generates signal B. In an embodiment, as shown in FIG. 1G, an AND gate is used to provide asymmetric rising and falling delays. In an embodiment, an inverted version of the clock signal is used directly as the ready signal.

Figure 2A:
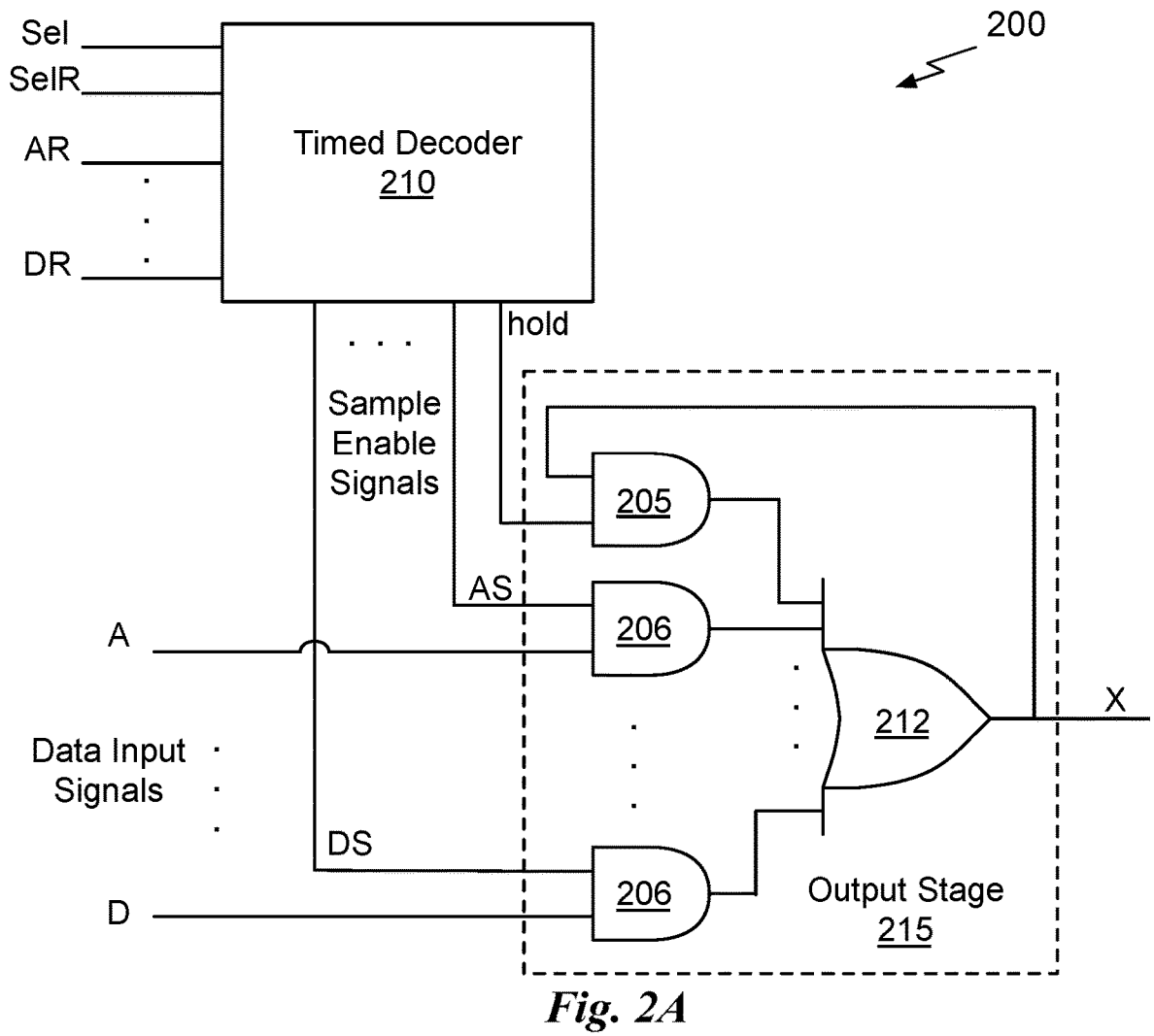
FIG. 2A illustrates a block diagram of a glitch-free N-to-1 multiplexer, in accordance with an embodiment.

FIG. 2A illustrates a block diagram of a glitch-free 4-to-1 multiplexer 200, in accordance with an embodiment. At a high level, a multiplexer is a logical component that receives multiple (N) data input signals and a select signal, then transmits one of the data input signals to the output signal based on the value of the select signal. For example, a multiplexer having inputs a, b, and select, and output c, may be configured such that c=a when select=0 and c=b when select=1. However, as the inputs a, b, and select glitch, the glitches are propagated to the output c. Reducing the glitching of the output c reduces the power consumed by combinational logic that receives output c as an input.

The previously described glitch-free technique may be used to implement the glitch-free 4-to-1 multiplexer 200, where the data input signals are A, . . . , D. The input ready signals AR, . . . DR are delay matched with the respective input signals. A select signal "Sel" selects one of the inputs to be sampled, and the sampled input is transferred to the output signal X. Feedback from X prevents glitches at the output by holding the previous level on X when hold is asserted.

The multiplexer 200 comprises a timed decoder 210 and an output stage 215, each having signal terminals carrying inputs and outputs to and from the circuit. Glitch-free multiplexing is achieved by associating a ready signal with each, possibly multi-bit, input signal (Sel and the data input signals). The ready signal goes high when the associated input signal has reached a steady state (e.g., constant or glitch-free value) for the current clock cycle. Signal AR, for example, indicates when input signal A is stable. The ready signals may be generated from the circuit clock signal by chains of inverters that are delay matched to the combinational logic block that generates each input signal. In some cases, an AND gate may be used in the chain to provide asymmetric rising and falling delays, as previously described in conjunction with FIGS. 1G and 1H. In other cases, the positive or negative version of the clock may be used directly as the ready signal.

The timed decoder 210 receives as inputs the select signal (Sel), a select ready signal (SelR), and multiple input ready signals (AR, . . . DR). The timed decoder 210 generates sample enable signals (AS, . . . DS), where each signal is asserted to enable sampling of the respective data input signal by the output stage 215. The timed decoder 210 also generates the hold signal. In the context of the following description, the sample enable signals may be considered a multi-bit sample (e.g., one-hot) enable signal, where each bit corresponds to a different one of the data input signals and respective ready signal. In an embodiment, the timing of the different sample enable signals may vary based on the SelR and the input ready signals.

Generally, each data input signal may be a multi-bit signal and the corresponding ready signal indicates that all of the bits of the data input signal are glitch-free. In an embodiment, the sample enable signal for each data input may be used to sample all bits of the multi-bit data input signal and the output stage 215 is replicated for each bit to generate the multi-bit output signal X.

The output stage 215 accepts the data input signals, the sample enable signals, and a hold signal as inputs. The output stage 215 generates at least one output signal. The output signal may be fed back to the output stage 215 for use as a hold feedback input. The timed decoder 210 is coupled to the output stage 215 in order to provide the sample enable signals to the output stage 215. The sample enable signals are timed to enable the output stage 215 to sample one of the data input signals according to the select input after each input signal has reached a final value in each clock cycle. The sampled signal is propagated to the at least one output signal, as further depicted in FIG. 2B.

The select ready and input ready signals, in conjunction with the hold signal, enable the multiplexer 200 to hold the output signal steady (unchanged) until all of the select and data input signals are ready, meaning at final settled values for the clock interval, as indicated by the respective ready signals. Timing differentials between the various signals reaching their own ready state may be incurred by the differing logic paths and combinational logic generating each data input and select signal. Individual ready signals may be tuned to provide a suitable delay based on the logical paths traversed by their corresponding data input signals. Once the select ready signal and ready signal corresponding to the selected data input indicate that the data input and select signal have reached a glitch-free and stable state, the multiplexer 200 propagates the selected data input to the output signal.

The output stage 215 depicted in FIG. 2A includes a select gate 206 for each data input signal (A through D), as well as a select gate 205 for the hold signal. The output stage 215 also includes an output gate 212. "Gate" refers to any logic configured to combine one or more inputs according to a logic equation or truth table. For example, an AND gate is logic to combine multiple inputs according to a Boolean AND operation. A gate does not imply a particular arrangement of transistors, and a gate may be implemented in some cases using combinations of different Boolean operations and suits the implementation.

Each select gate 205 and 206 may perform logically as a two-input AND gate. The select gates 206 each receive a data input signal and the respective sample enable signal (A and AS, B and BS . . . ) as input. When the sample enable signal is a logical "1", the output of the select gate matches the input. When the select signal is a logical "0", the output of the select gate is logical "0". In an embodiment, the timed decoder 210 is configured as a one-hot output generator such that no more than one sample enable signal is high (a logical "1") at any given time.

The outputs of the select gates 206 are coupled to the output gate 212 inputs. The output gate 212 may act as a multi-input OR gate. In this manner, the signal sampled as previously described at the select gates 206 may be propagated to the output signal X through the output gate 212. In an embodiment, the output signal X is also fed back as input to the select gate 205. The select gate 206 is configured as a feedback input to the output gate 212 to hold the output signal X high while the hold signal is high. In this manner, when the hold signal is high, the output signal is selected as the next input to be propagated through the output gate 212, effectively holding that output signal steady for the clock interval. In other words, when the hold signal is asserted (and all of the sample enable signals are low) the output signal X maintains its current state.

The hold signal must remain asserted until one of the sample enable signals (AS . . . DS) is asserted to prevent glitches at the output when the selected input signal is sampled. Specifically, when the output signal X is asserted (high) and the selected input signal (A . . . D) is high, overlap of hold and the sample enable signal ensures that the output signal X does not glitch low (e.g., when output signal X is high, it does not transition low and return high within a clock cycle). If the overlap is not used, a low glitch may occur, caused by a race condition when hold transitions low. The low glitch can occur when an input signal has a high value and the output of the select gate 205 transitions low before the sample enable signal transitions high at the input to the select gate 206, causing all of the inputs to the output gate 212 to be low simultaneously.

The feedback path is inexpensive in terms of transistors and power—the cost of a single NAND gate, which typically is four to six transistors. The added resource cost is similar to adding an additional input to the multiplexer 200 and is less expensive than adding a flip-flop. The feedback path, along with appropriate sequencing of the hold and sample enable signals, prevents glitching of the output signal X of the multiplexer 200.

Those of ordinary skill in the art will readily recognize that the output stage 215 may comprise additional or somewhat different elements not depicted and unnecessary to this description. AND gates are used to depict the select gates 205 and 206, and an OR gate depicts the output gate 212 because these symbols indicate the function of the underlying logic for generating the output signal based on the inputs. However, other combinations of logic may also be implemented to effect the indicated functionality. Five two-input NAND gates may feed a single five-input NAND gate, for example. Alternately, three AND-OR-INVERTs (AOIs) may feed a three-input NAND gate. Numerous circuits may be used to achieve the same logical result while impacting the number of transistors used, the delay incurred, and the power consumed, in accomplishing the desired logical result. Those of ordinary skill in the art will readily recognize that the multiplexer 200 may comprise additional or somewhat different elements not depicted and unnecessary to this description.

The multiplexer 200 provides a reliably steady output signal value even when data input and/or the Sel signals change values multiple times and/or at different times. Therefore, power consumption and noise related to glitching and unnecessary switching of the output signal is reduced for the multiplexer 200, as well as the extraneous work performed by circuits receiving a potentially unstable signal as input.

Figure 2B:
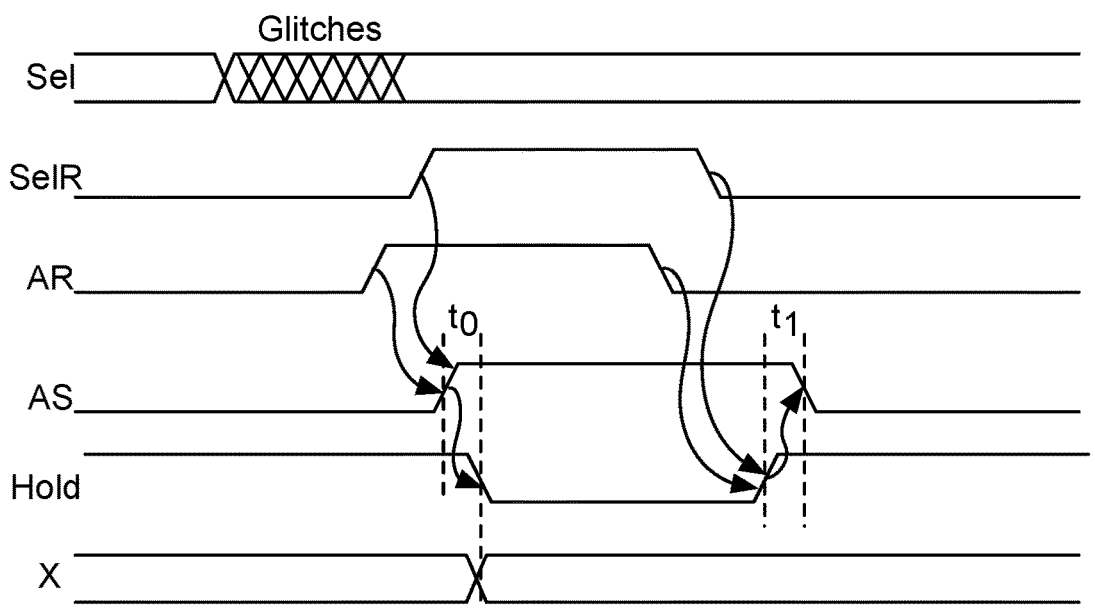
FIG. 2B illustrates timing diagram for the glitch-free N-to-1 multiplexer of FIG. 2A, in accordance with an embodiment.

FIG. 2B illustrates timing diagram for the glitch-free 4-to-1 multiplexer 200 of FIG. 2A, in accordance with an embodiment. The timing diagram depicts the timing sequence for the sample enable signals generated by the timed decoder 210 to enable glitchless multiplexing, where arrows indicate causality. Signal SelR is asserted to indicate that the select signal Sel is ready. Before signal SelR is asserted, Sel may glitch one or more times, changing between values (as shown by the transitions labeled "glitches") until reaching a stable state, after which SelR is asserted. In the example, the select signal selects data input signal A, and input ready signal AR is asserted before SelR is asserted, indicating that the data input signal A is ready. In response to both AR and SelR being asserted, the timed decoder 210 asserts the sample enable signal AS to sample the data input signal A and propagate the sampled value to the output signal X of the multiplexer 200.

If the AR signal is not already asserted when SelR is asserted, the timed decoder 210 waits for the AR signal to be asserted before asserting the AS signal. After a short overlap delay (to) following the assertion of the AS signal, the hold signal is de-asserted (negated). The overlap of the assertion of signals AS and hold during the time to is for the situation where a bit of output signal X and data input signal A are both asserted. The overlap ensures that this bit of output signal X does not glitch to a de-asserted state between the time the hold select gate 205 output in the output stage 215 becomes de-asserted and the A select gate 206 output in the output stage 215 is asserted. To reset the multiplexer 200 for the next clock cycle, after the SelR signal and the AR are both de-asserted, the hold signal is asserted, and after an overlap delay ($t_1$), the AS signal is de-asserted. The time durations of delays $t_0$ and $t_1$ may be equal or different. In an embodiment, the time durations of delays $t_0$ and $t_1$ approximates the delay of a logic gate. An inverted version of the hold signal—possibly with a delay added—may be used as an "output ready" signal XR in some implementations.

Figure 2C:
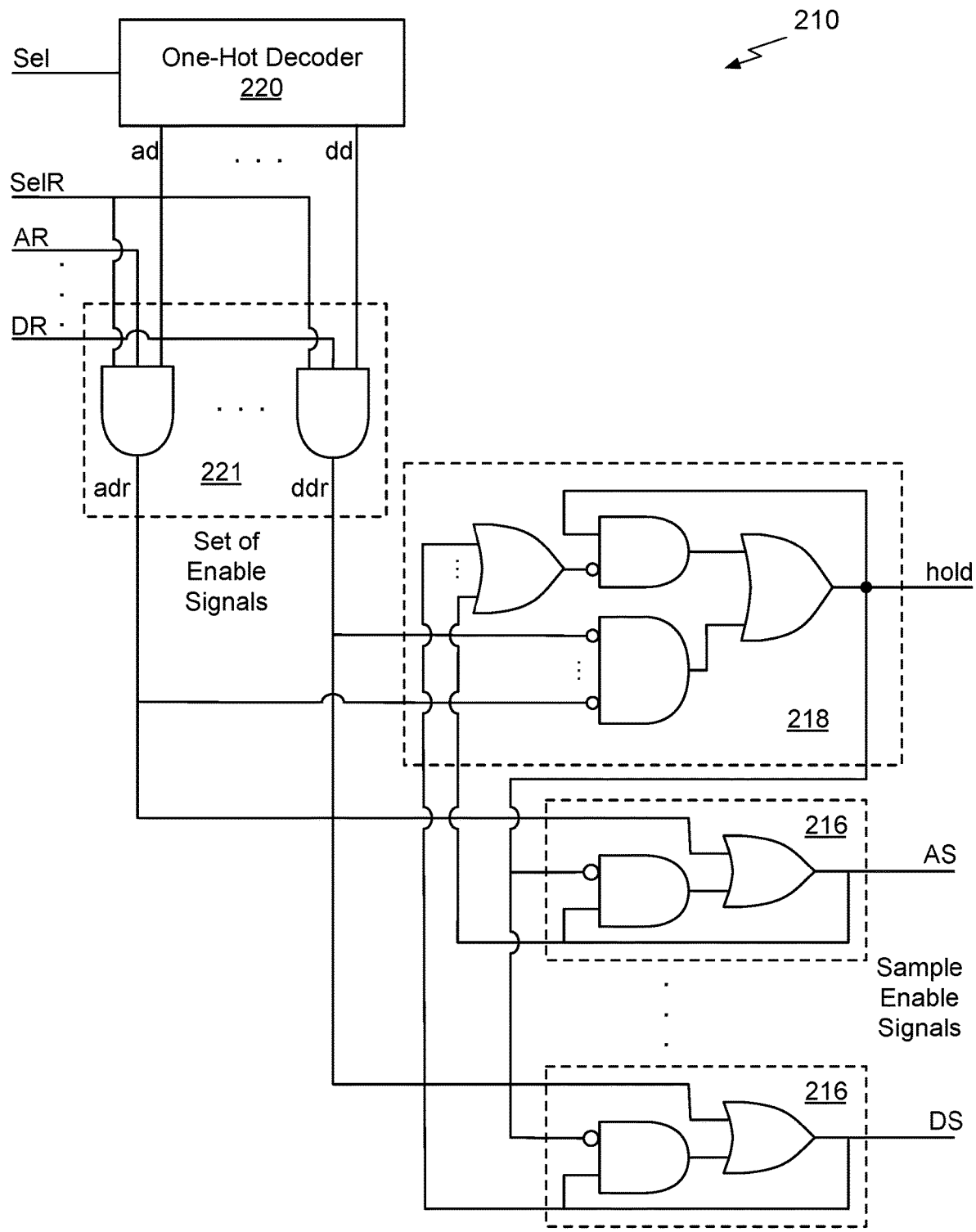
FIG. 2C illustrates a block diagram of the timed decoder of FIG. 2A, in accordance with an embodiment.

FIG. 2C illustrates a block diagram of the timed decoder 210 of FIG. 2A, in accordance with an embodiment. Sequential logic is added to sequence the hold and sample enable signals AS, . . . , DS to avoid glitches. If the Sel signal input is already in one-hot form, the one-hot decoder 220 may be omitted.

Each one-hot signal ad, . . . , dd is qualified in ready signal logic 221 by the select ready signal SelR and the corresponding input ready signal, e.g., AR for input signal A, and so on. The AND gates of the ready signal logic 221 performing the qualification may be implemented within the one-hot decoder 220 or by expanding the AND gates in sample enable signal logic 216 and hold signal logic 218, depending on the implementation.

The resulting decoded ready signals adr, . . . , ddr output from the ready signal logic 221 are applied to drive a set of reset/set (RS) flip-flops or latches, implemented as AND-OR gates in the depicted embodiment, to generate the input select signals AS, . . . , DS and hold. The combinational logic comprising sample enable logic 216 blocks and hold signal logic 218 is gated by the ready signal logic 221 to generate the sample enable and hold signals.

When a decoded input ready signal such as adr is asserted, it sets the output of a latch implemented by the corresponding sample enable signal logic 216, such as signal AS. When any of sample enable signals, such as AS, is asserted, it resets the flip-flop implemented in hold signal logic 218—causing the hold signal to fall. If additional overlap is needed for reliable operation, delay circuits may be inserted into the reset path. However, the delay of the RS flip-flop in the sample signal logic 216 itself may be adequate in many cases to avoid a de-assertion glitch when the held output signal X and the newly selected input signal are both asserted.

For a multi-bit multiplexer (one that is enabled to select multi-bit input signals to a multi-bit output signal), each sample enable logic 216 block (e.g., AND-OR gate configuration), performs an operation of a RS flip-flop or latch for all bits for one multi-bit input signal. Other low gate count configurations for RS/SR flip-flop behavior may also be utilized.

To reset the timed decoder 210 and prepare it for the next clock cycle, when an enable signal, such as adr goes low, the hold RS flip-flop implemented in the hold signal logic 218 is set. Because one enable signal is asserted at a time, the condition is detected in the hold signal logic 218 by a NOR gate (e.g., an AND gate with inverted inputs) configured to detect all of the enable signal being de-asserted. The hold signal becoming asserted then resets the selected RS flip-flop in the sample enable logic 216. Delay may be inserted in the hold-to-sample enable reset path if needed to extend the overlap period.

Figure 2D:
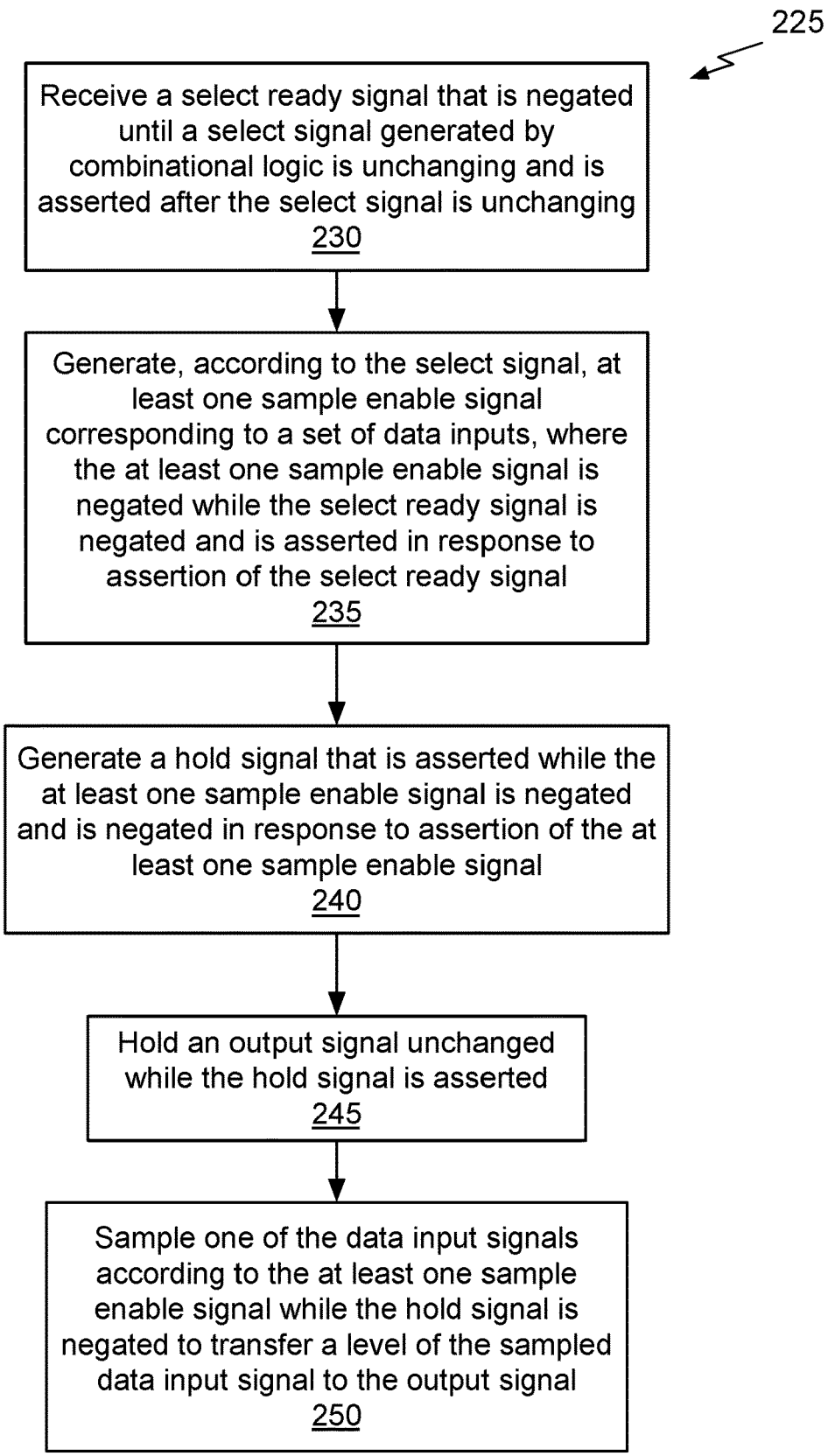
FIG. 2D illustrates a flowchart of a method for generating a glitch-free multiplexer output signal, in accordance with an embodiment.

FIG. 2D illustrates a flowchart of a method 225 for generating a glitch-free multiplexer output signal, in accordance with an embodiment. The method 225 may be performed by logic or custom circuitry. For example, the method 225 may be executed by a GPU, CPU, or any processor capable of generating the glitch-free signal. Furthermore, persons of ordinary skill in the art will understand that any system that performs method 225 is within the scope and spirit of embodiments of the present disclosure.

At step 230, a select ready signal is received at the timed decoder 210. The select ready signal is negated until a select signal generated by combinational logic is unchanging (glitch-free) and is asserted after the select signal is unchanging. At step 235, the timed decoder 210 generates at least one sample enable signal according to the select signal, where the at least one sample enable signal corresponds to a set of data input signals. The at least one sample enable signal is negated while the select ready signal is negated and is asserted when the select ready signal and the corresponding data ready signal are both asserted.

In an embodiment, the select signal comprises a multi-bit signal, and each bit in the select signal is associated with a different one of the data input signals in the set of data input signals and only one bit is asserted at a time. For example, the select signal may be one-hot encoded by the one-hot decoder 220 to produce adr, . . . , ddr. In an embodiment, each one of the bits in the select signal is used to sample the associated data input signal. For example, the multi-bit select signal is used to generate the sample enable signals that are each associated with a different one of the data input signals. In an embodiment, the select signal may be binary encoded where each binary pattern selects one of the data input signals.

In an embodiment, the timed decoder 210 receives a set of ready signals, each ready signal in the set associated with a different one of the data input signals in the set of data input signals. Furthermore, each ready signal is negated until the associated data input signal is unchanging and each ready signal is asserted after the associated data input signal is unchanging.

In an embodiment, the timed decoder 210 is further configured to generate a set of enable signals, such as adr, . . . , ddr, where each enable signal in the set is associated with a different one of the data input signals in the set of data input signals. Furthermore, each one of the enable signals is negated while the associated ready signal is negated and each one of the enable signals is asserted in response to assertion of the associated ready signal when the associated data input signal is asserted.

At step 240, the timed decoder 210 generates a hold signal that is asserted while the at least one sample enable signal is negated and is negated in response to assertion of the at least one sample enable signal. In an embodiment, the timed decoder 210 is configured to assert the hold signal while the hold signal is asserted and the at least one sample enable signal is negated. In an embodiment, the hold signal and the at least one sample enable signal are both asserted for a first time duration (e.g., $t_0$ and/or $t_1$). In an embodiment, the hold signal is inverted to produce an output ready signal associated with the output signal.

At step 245, a sampling circuit, such as the output stage 215, holds an output signal unchanged while the hold signal is asserted. At step 250, one of the data input signals is sampled according to the at least one sample enable signal while the hold signal is negated to transfer a value of the sampled data input signal to the output signal.

In an embodiment, the set of input data signals includes three input data signals and the select signal is configured to select one of the three input data signals to produce the output signal. In an embodiment, the set of input data signals includes four input data signals and the select signal is configured to select two of the four input data signals to produce the output signal and an additional output signal.

A particular embodiment of a glitchless multiplexer is a 4-2 multiplexer that simultaneously selects two of four inputs $a_0$ through $a_3$ to be propagated to two output signals $q_0$ and $q_1$. With order maintained, there are six possibilities encoded by a three-bit select signal for such a multiplexer as set forth in Table 1:

TABLE 1

| sel | q0 | q1 |
|-----|----|----|
| 0 | a0 | a1 |
| 1 | a0 | a2 |
| 2 | a0 | a3 |
| 3 | a1 | a2 |
| 4 | a1 | a3 |
| 5 | a2 | a3 |

The datapath of the 4-2 multiplexer may be implemented as two 3-1 multiplexers with the corresponding decoded input ready signals derived from the 3-6 decoding scheme as indicated in the following equations:

For the 3-1 multiplexer producing $q_0$:
a00dr=(s0$\vee$s1$\vee$s2)$\wedge$selr$\wedge$a0r
a01dr=(s3$\vee$s4)$\wedge$selr$\wedge$a1r
a02dr=s5$\wedge$selr$\wedge$a2r For the 3-1 multiplexer producing $q_1$:
a11dr=s0$\wedge$selr$\wedge$a1r
a12dr=(s1$\vee$s3)$\wedge$selr$\wedge$a2r
a13dr=(s2$\vee$s4 V s5)$\wedge$selr$\wedge$a3r Here sx (where x is valued from 0-5) indicates the select signal is named x; auvdr is the decoded input ready signal that gates input signal av to output signal qu. These signals are applied to drive four RS latches for each 3-1 multiplexer of the 4-2 multiplexer. For the q0 multiplexer three RS latches produce signals a00s, a01s, and a02s—enabling the path from inputs a0, a1, and a2 to q0 respectively. The final RS latch holds q0. A similar set of four RS latches controls the q1 multiplexer. For example, the equation for the a00s RS latch is:

a00s=a00dr$\vee$(a00s$\wedge$(hold0)').

Figure 2E:
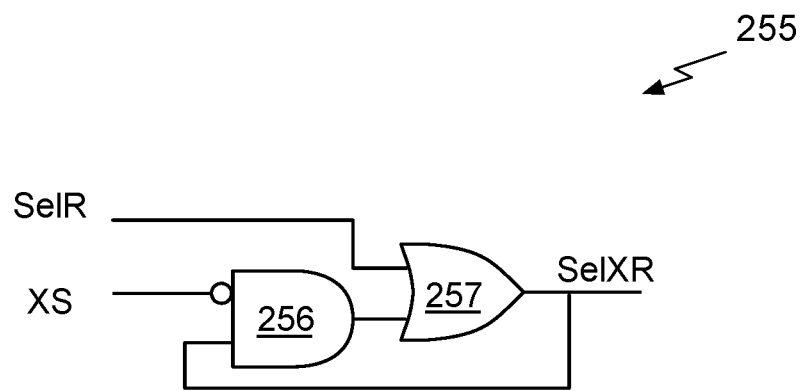
FIG. 2E illustrates a stretch ready signal generation circuit, in accordance with an embodiment.

FIG. 2E illustrates a stretch ready signal generation circuit 255, in accordance with an embodiment. An RS flip-flop comprising an AND gate 256 and OR gate 257 is utilized to stretch the select ready signal to ensure overlap with the input ready signal. For a glitch-free multiplexer to function correctly, the select ready (SelR) signal and input ready signal (XR) overlap by enough time to set the selected RS flip-flop in the sample enable signal logic 216 of the timed decoder 210. If the input ready signal is delayed by much more than the select ready signal, the overlap may not occur. This problem may be addressed by utilizing an additional RS flip-flop to stretch the select ready signal. The stretched signal (SelXR) is set by SelR going high and cleared by the corresponding sample enable signal (XS) going high. The timed decoder 210 may be modified to include the additional RS flip-flop for each input data signal. Specifically, the stretch ready signal generation circuit 255 may be inserted to replace the SelR input to each AND gate within the ready signal logic 221.

Figure 2F:
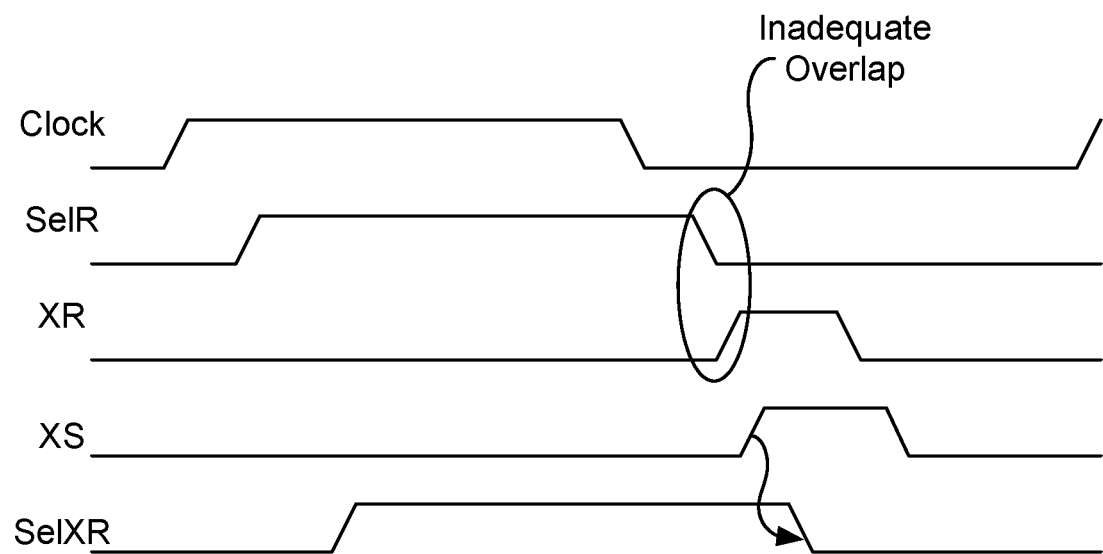
FIG. 2F illustrates timing diagram for the stretch ready signal generation circuit of FIG. 2E, in accordance with an embodiment.

FIG. 2F illustrates timing diagram for the stretch ready signal generation circuit 255 of FIG. 2E, in accordance with an embodiment. Because there is inadequate overlap time when both SelR and XR are asserted, the stretched SelR signal SelXR is used to generate XS. SelXR is reset in response to XS being asserted. SelXR is set in response to SelR being asserted.

In some cases, the input ready signals persist longer than needed and may unnecessarily delay the reset of the glitch-free N-to-1 multiplexer 200 to prepare it for the next set of inputs. A quick-return circuit may be implemented on the input ready signal. The quick-return circuit returns the input ready signal to a de-asserted state soon after the output ready signal is detected.

Figure 2G:
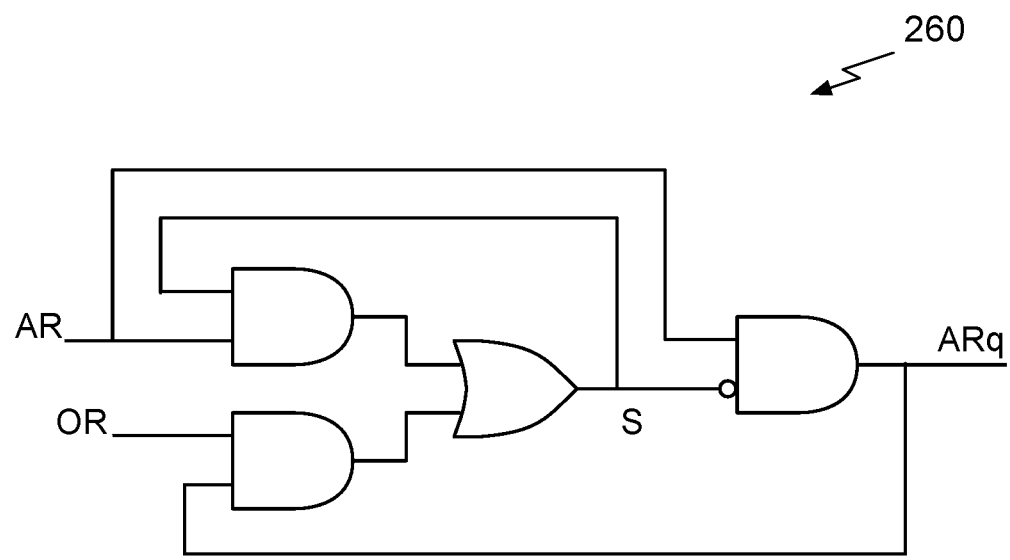
FIG. 2G illustrates a quick return circuit, in accordance with an embodiment.

FIG. 2G illustrates a quick return circuit 260, in accordance with an embodiment. The logic equations for this circuit are:
ARq=AR$\wedge$S'
S=(AR$\wedge$S)$\vee$(ARq$\wedge$OR)

Here AR is the input data ready signal, ARq is the quick-return version of the input data ready signal, OR is the output ready signal—a delayed version of AS, S is a state variable, and S' is the complement signal of S.

Figure 2H:
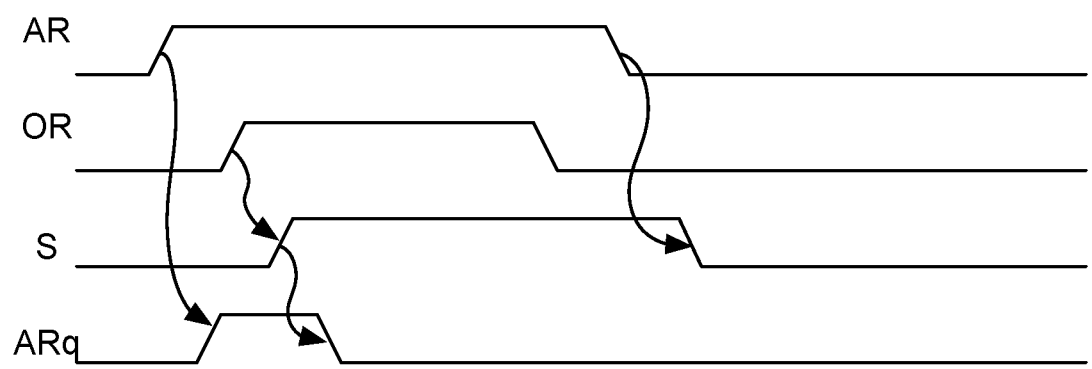
FIG. 2H illustrates timing diagram for the quick return circuit of FIG. 2G, in accordance with an embodiment.

FIG. 2H illustrates timing diagram for the quick return circuit 260 of FIG. 2G, in accordance with an embodiment. Signal ARq rises when input ready signal AR rises, but falls as soon as output ready signal OR goes high. Signal AR goes high and stays high for a period of time. To enable the glitch-free N-to-1 multiplexer 200 to reset sooner, the quick return circuit 260 generates signal ARq that returns to zero with low latency after OR goes high. The quick return behavior is enabled by setting state signal S that is generated by an RS flip-flop. The RS flip-flop is set by OR going high while ARq is high. The RS flip flop holds S high until it is reset by AR going low.

In other cases, the output ready signal (OR) may be prolonged until all outputs it is being combined with are also ready and the combination is accepted by the subsequent circuit. This event may be signaled by an ack signal (which may also be the output ready signal of the subsequent circuit). In these cases, using the complement hold signal as OR may not endure long enough to meet the timing constraints of the implementation. A prolonged output ready signal may be generated using an RS flip-flop that is set when hold is de-asserted and reset when ack is asserted:

OR=hold'$\vee$(ack' $\wedge$OR)

In this case, the hold signal logic 218 of FIG. 2C may be modified to prevent hold from becoming de-asserted again until ack is asserted.

The glitch-free technique may be used to reduce power consumption for multiplexer logic. Preventing the output signal from changing until a glitch-free value can be propagated to the output signal results in the output signal transitioning only once (or remaining constant) each clock cycle. When the output signal glitches, logic receiving the signal may change in response, thereby charging and/or discharging nodes within the logic and consuming power. Providing a glitch-free signal may reduce the number of time the nodes are charged and/or discharged, thereby reducing the power consumed by the logic.

The glitch-free technique associates a ready signal with each input for the glitch-free multiplexer to control sampling of the selected input once the inputs are stable and glitch-free. Embodiments of a sampling element include a transparent latch or a multiplexer with feedback. The ready signals are each delay matched with an associated input and may be prolonged, an asymmetric pulse, or a quickly reset ready. Within the multiplexer, a hold signal is generated to hold the output signal stable via a feedback path until the sampled signal value is propagated. The hold signal may also be used to generate an output ready signal.

The glitch-free technique may be implemented within any circuitry comprising combinational and sequential logic. For example, the glitch-free technique may be used within one or more logic blocks within a processor and for input to or output of the processor. In particular, a glitch-free multiplexer may be used to select only non-zero activations and/or weights for convolution operations. In an embodiment, the glitch-free technique may be implemented within a parallel processing architecture, as described further herein.

Parallel Processing Architecture

Figure 3:
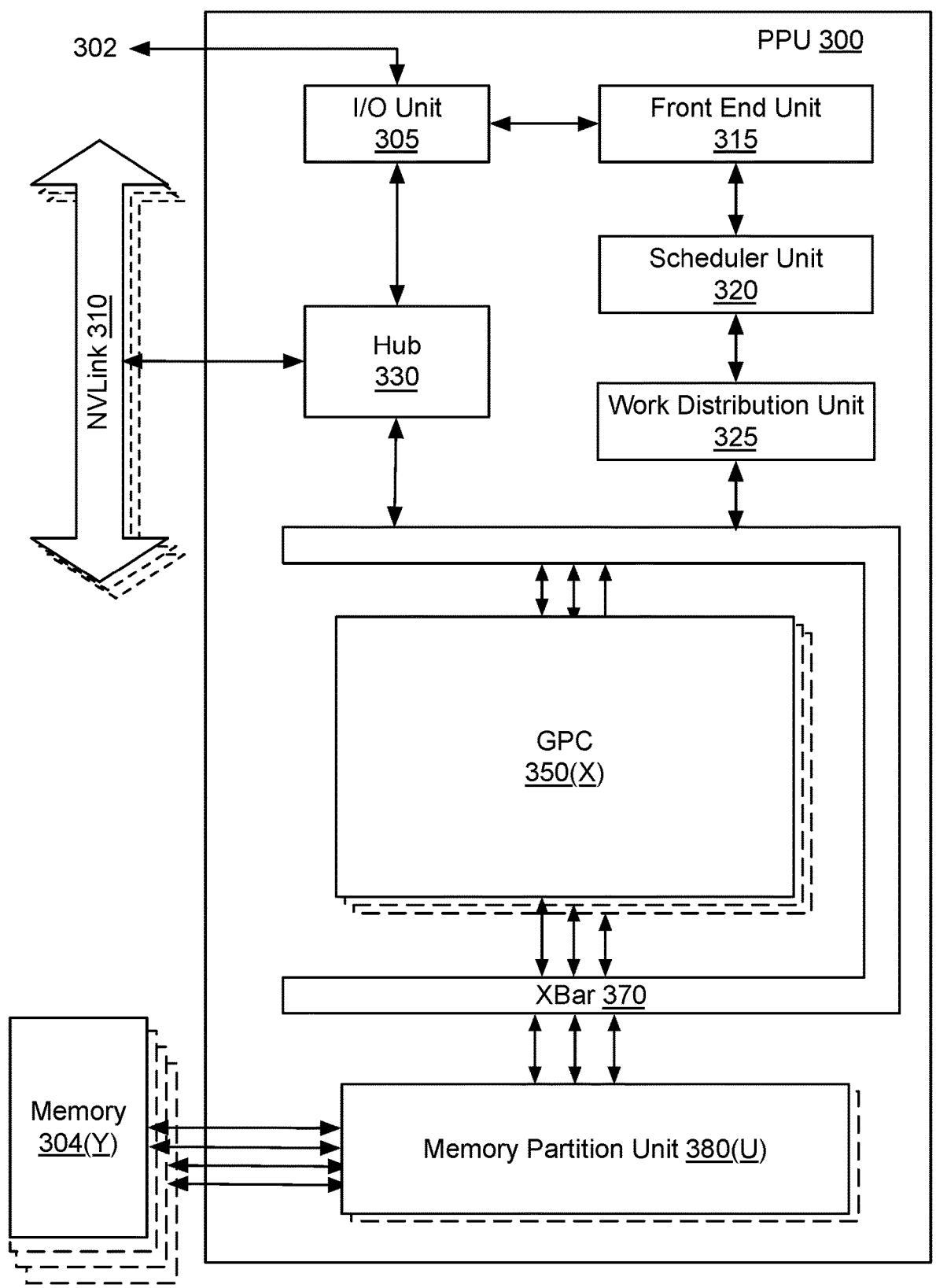
FIG. 3 illustrates a parallel processing unit, in accordance with an embodiment.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
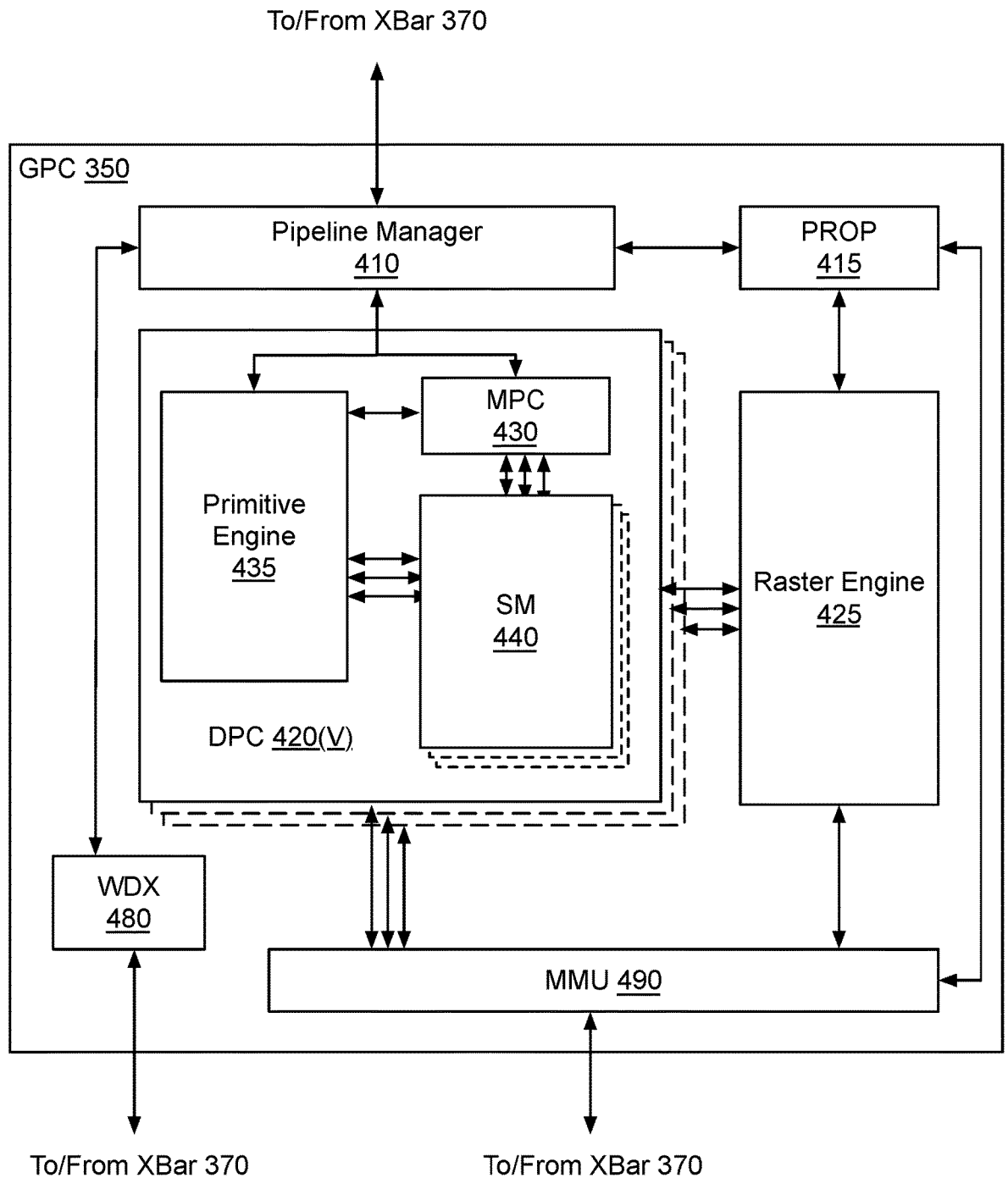
FIG. 4A illustrates a general processing cluster within the parallel processing unit of FIG. 3, in accordance with an embodiment.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
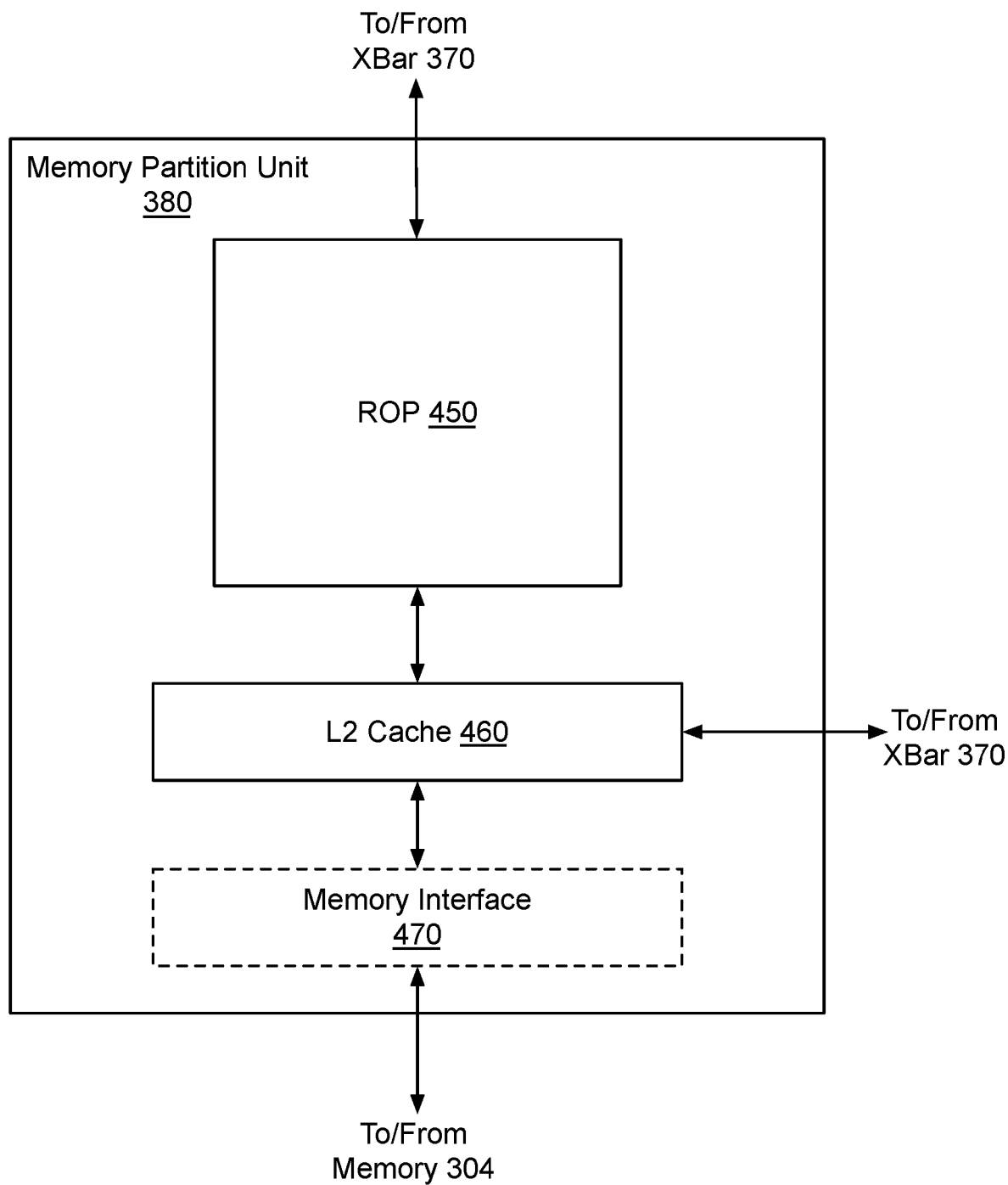
FIG. 4B illustrates a memory partition unit of the parallel processing unit of FIG. 3, in accordance with an embodiment.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
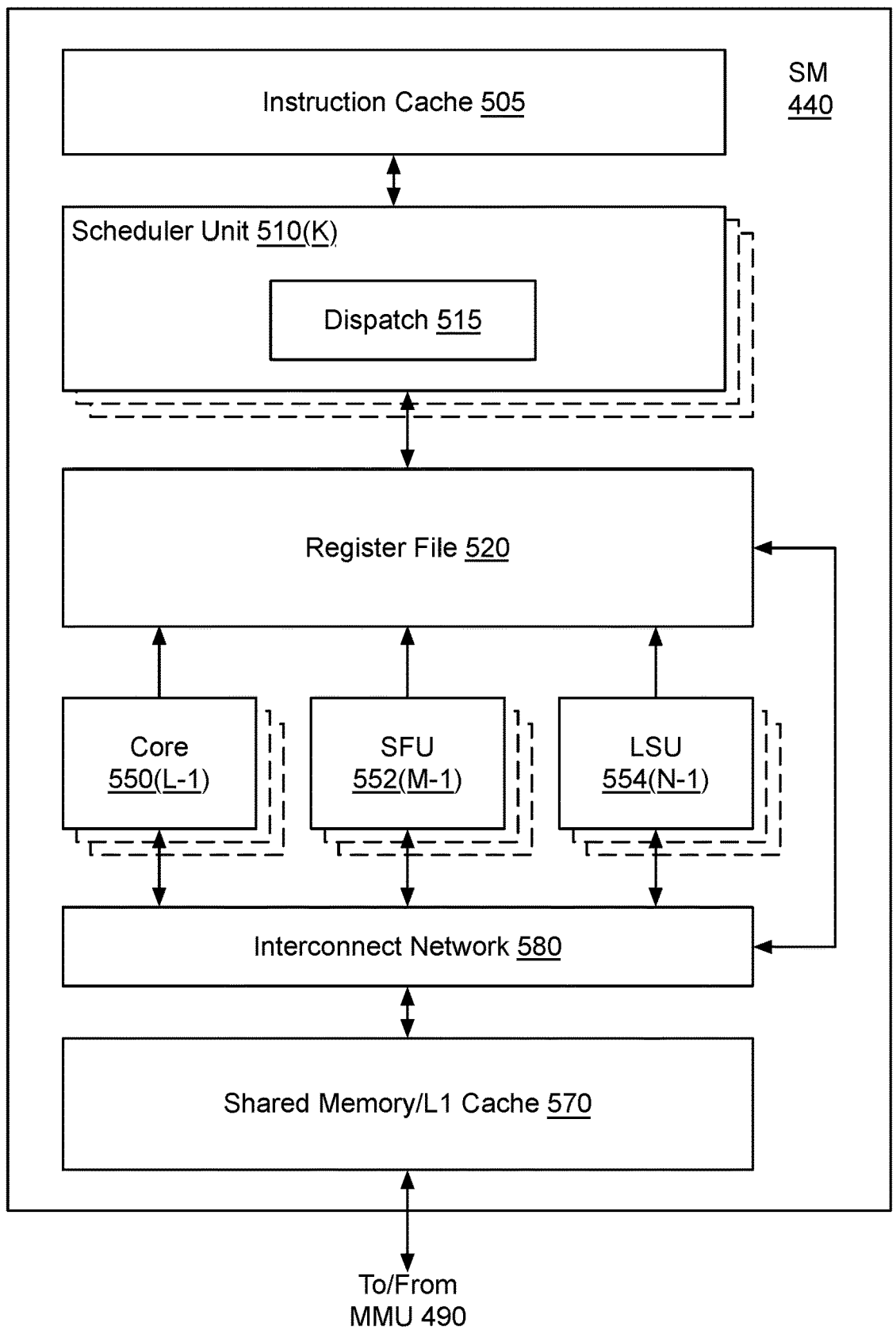
FIG. 5A illustrates the streaming multi-processor of FIG. 4A, in accordance with an embodiment.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (e.g., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 470. The texture units implement texture operations such as filtering operations using mip-maps (e.g., texture maps of varying levels of detail). In an embodiment, each SM 340 includes two texture units.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the memory partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5B:
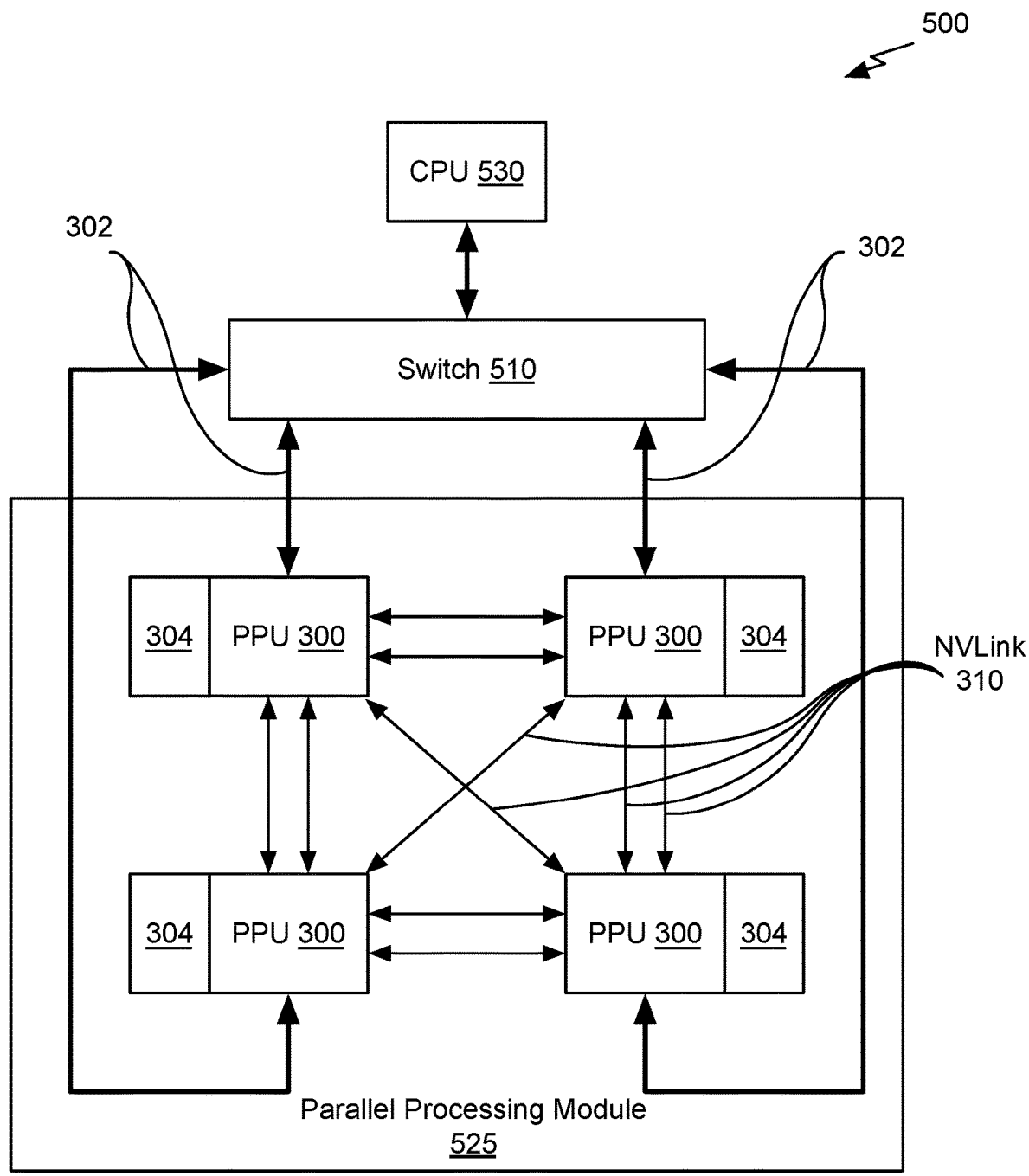
FIG. 5B is a conceptual diagram of a processing system implemented using the PPU of FIG. 3, in accordance with an embodiment.

FIG. 5B is a conceptual diagram of a processing system 500 implemented using the PPU 300 of FIG. 3, in accordance with an embodiment. The exemplary system 565 may be configured to implement the method 115 shown in FIG. 1C and/or the method 225 shown in FIG. 2D. The processing system 500 includes a CPU 530, switch 510, and multiple PPUs 300, and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
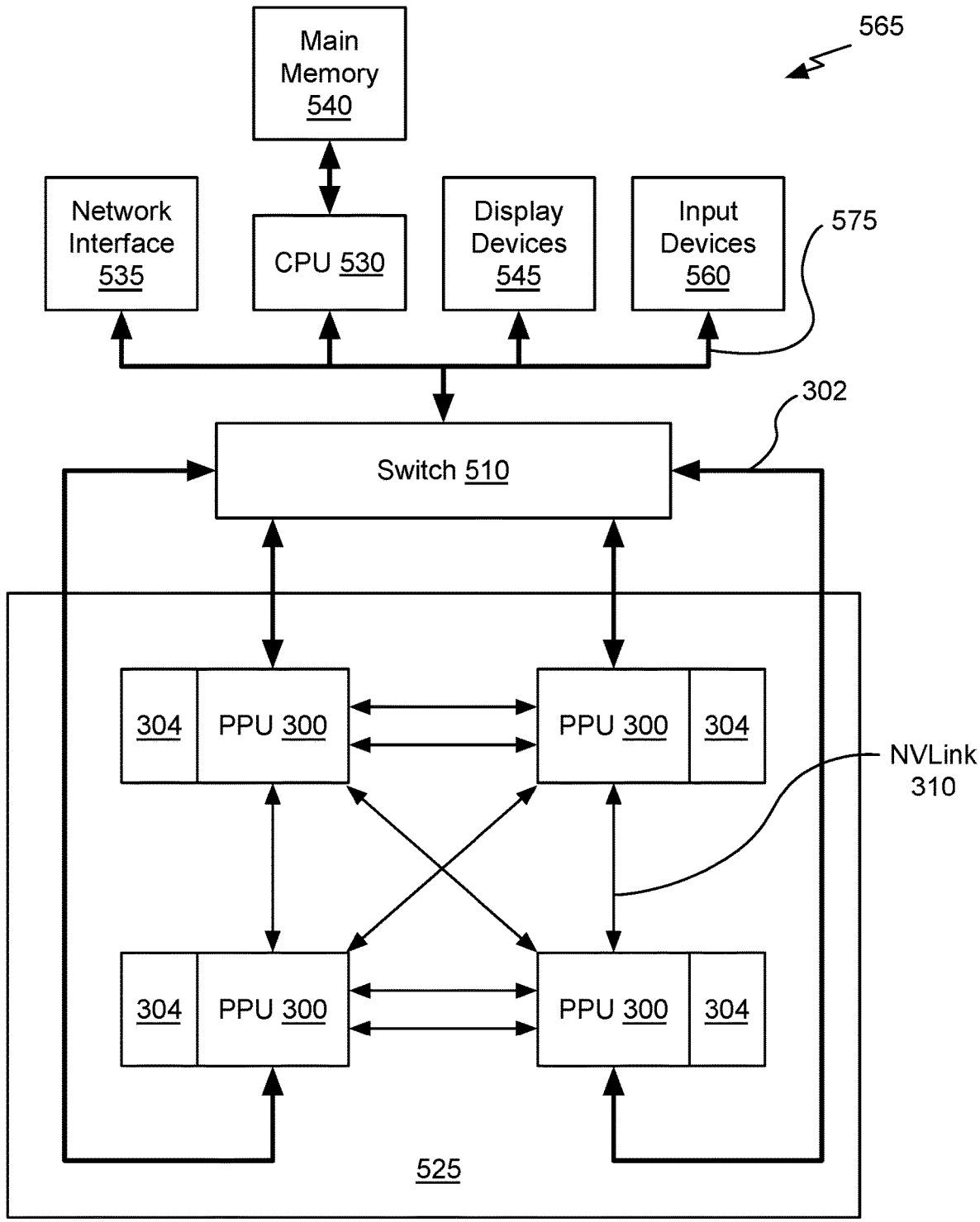
FIG. 5C illustrates an exemplary system in which the various architecture and/or functionality of the various previous embodiments may be implemented.

FIG. 5C illustrates an exemplary system 565 in which the various architecture and/or functionality of the various previous embodiments may be implemented. The exemplary system 565 may be configured to implement the method 115 shown in FIG. 1C and/or the method 225 shown in FIG. 2D.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, e.g. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (e.g., pixel data for each of the pixels of the display).

An application writes model data for a scene (e.g., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (e.g., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Images generated applying one or more of the techniques disclosed herein may be displayed on a monitor or other display device. In some embodiments, the display device may be coupled directly to the system or processor generating or rendering the images. In other embodiments, the display device may be coupled indirectly to the system or processor such as via a network. Examples of such networks include the Internet, mobile telecommunications networks, a WIFI network, as well as any other wired and/or wireless networking system. When the display device is indirectly coupled, the images generated by the system or processor may be streamed over the network to the display device. Such streaming allows, for example, video games or other applications, which render images, to be executed on a server or in a data center and the rendered images to be transmitted and displayed on one or more user devices (such as a computer, video game console, smartphone, other mobile device, etc.) that are physically separate from the server or data center. Hence, the techniques disclosed herein can be applied to enhance the images that are streamed and to enhance services that stream images such as NVIDIA GeForce Now (GFN), Google Stadia, and the like.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron is the most basic model of a neural network. In one example, a neuron may receive one or more inputs that represent various features of an object that the neuron is being trained to recognize and classify, and each of these features is assigned a certain weight based on the importance of that feature in defining the shape of an object.

A deep neural network (DNN) model includes multiple layers of many connected nodes (e.g., neurons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

Furthermore, images generated applying one or more of the techniques disclosed herein may be used to train, test, or certify DNNs used to recognize objects and environments in the real world. Such images may include scenes of roadways, factories, buildings, urban settings, rural settings, humans, animals, and any other physical object or real-world setting. Such images may be used to train, test, or certify DNNs that are employed in machines or robots to manipulate, handle, or modify physical objects in the real world. Furthermore, such images may be used to train, test, or certify DNNs that are employed in autonomous vehicles to navigate and move the vehicles through the real world. Additionally, images generated applying one or more of the techniques disclosed herein may be used to convey information to users of such machines, robots, and vehicles.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A circuit, comprising:
    a decoder circuit configured to:
        receive a select ready signal that is negated until a select signal generated by combinational logic is unchanging and is asserted after the select signal is unchanging;
        generate, according to the select signal, at least one sample enable signal corresponding to a set of data input signals, wherein the at least one sample enable signal is negated while the select ready signal is negated and is asserted in response to assertion of the select ready signal; and
        generate a hold signal that is asserted while the at least one sample enable signal is negated and is negated in response to assertion of the at least one sample enable signal; and
    a sampling circuit configured to:
        hold an output signal unchanged while the hold signal is asserted, wherein the sampling circuit comprises a feedback loop configured to assert the output signal while the hold signal is asserted and the output signal is asserted; and
        sample one of the data input signals according to the at least one sample enable signal while the hold signal is negated to transfer a level of the sampled data input signal to the output signal.

2. The circuit of claim 1, wherein the select signal comprises a multi-bit signal, and each bit in the select signal is associated with a different one of the data input signals in the set of data input signals and only one bit is asserted at a time.

3. The circuit of claim 2, wherein each one of the bits in the select signal is used to sample the associated data input signal.

4. The circuit of claim 2, wherein the decoder circuit is further configured to:
    receive a set of ready signals, each ready signal in the set associated with a different one of the data input signals in the set of data input signals, wherein
        each ready signal is negated until the associated data input signal is unchanging and
        each ready signal is asserted after the associated data input signal is unchanging.

5. The circuit of claim 4, wherein the decoder is further configured to generate a set of enable signals, each enable signal in the set associated with a different one of the data input signals in the set of data input signals, wherein
    each one of the enable signals is negated while the associated ready signal is negated; and
    each one of the enable signals is asserted in response to assertion of the associated ready signal when the associated data input signal is asserted.

6. The circuit of claim 1, wherein the decoder is further configured to:
    receive a set of ready signals, each ready signal in the set associated with a different one of the data input signals in the set of data input signals, wherein
        each ready signal is negated until the associated data input signal is unchanging and
        each ready signal is asserted after the associated data input signal is unchanging.

7. The circuit of claim 1, wherein the decoder circuit is further configured to assert the hold signal while the hold signal is asserted and the at least one sample enable signal is negated.

8. The circuit of claim 1, wherein the hold signal and the at least one sample enable signal are both asserted for a first time duration.

9. A circuit, comprising:
    a decoder circuit configured to:
        receive a select ready signal that is negated until a select signal generated by combinational logic is unchanging and is asserted after the select signal is unchanging;
        generate, according to the select signal, at least one sample enable signal corresponding to a set of data input signals, wherein the at least one sample enable signal is negated while the select ready signal is negated and is asserted in response to assertion of the select ready signal; and
        generate a hold signal that is asserted while the at least one sample enable signal is negated and is negated in response to assertion of the at least one sample enable signal; and
    a sampling circuit configured to:
        hold an output signal unchanged while the hold signal is asserted;
        invert the hold signal to produce an output ready signal; and sample one of the data input signals according to the at least one sample enable signal while the hold signal is negated to transfer a level of the sampled data input signal to the output signal.

10. The circuit of claim 1, wherein the set of input data signals includes three input data signals and the select signal is configured to select one of the three input data signals to produce the output signal.

11. The circuit of claim 1, wherein the set of input data signals includes four input data signals and the select signal is configured to select two of the four input data signals to produce the output signal and an additional output signal.

12. The circuit of claim 1, wherein the circuit is included within a processor configured to generate an image and the processor is a part of a server or a data center, and the image is streamed to a user device.

13. The circuit of claim 1, wherein the circuit is included within a processor configured to train, test, or certify a neural network employed in a machine, robot, or autonomous vehicle.

14. The circuit of claim 1, wherein the circuit is included within a processor configured to implement a neural network model.

15. A method, comprising:
receiving a select ready signal that is negated until a select signal generated by combinational logic is unchanging and is asserted after the select signal is unchanging;
generating, according to the select signal, at least one sample enable signal corresponding to a set of data input signals, wherein the at least one sample enable signal is negated while the select ready signal is negated and is asserted in response to assertion of the select ready signal;
generating a hold signal that is asserted while the at least one sample enable signal is negated and is negated in response to assertion of the at least one sample enable signal;
holding an output signal unchanged while the hold signal is asserted, wherein a feedback loop is configured to assert the output signal while the hold signal is asserted and the output signal is asserted; and
sampling one of the data input signals according to the at least one sample enable signal while the hold signal is negated to transfer a value of the sampled data input signal to the output signal.

16. The method of claim 15, wherein the select signal comprises a multi-bit signal, and each bit in the select signal is associated with a different one of the data input signals in the set of data input signals and only one bit is asserted at a time.

17. The method of claim 16, further comprising:
receiving a set of ready signals, each ready signal in the set associated with a different one of the data input signals in the set of data input signals, wherein
each ready signal is negated until the associated data input signal is unchanging and
each ready signal is asserted after the associated data input signal is unchanging.

18. The method of claim 15, wherein the steps of generating, receiving, and sampling are performed within a processor configured to implement a neural network model.

19. A method, comprising:
receiving a select ready signal that is negated until a select signal generated by combinational logic is unchanging and is asserted after the select signal is unchanging;
generating, according to the select signal, at least one sample enable signal corresponding to a set of data input signals, wherein the at least one sample enable signal is negated while the select ready signal is negated and is asserted in response to assertion of the select ready signal;
generating a hold signal that is asserted while the at least one sample enable signal is negated and is negated in response to assertion of the at least one sample enable signal;
holding an output signal unchanged while the hold signal is asserted;
inverting the hold signal to produce an output ready signal; and
sampling one of the data input signals according to the at least one sample enable signal while the hold signal is negated to transfer a value of the sampled data input signal to the output signal.

20. The method of claim 19, further comprising receiving a set of ready signals, each ready signal in the set associated with a different one of the data input signals in the set of data input signals, wherein
each ready signal is negated until the associated data input signal is unchanging and
each ready signal is asserted after the associated data input signal is unchanging.

* * * * *